US008779412B2

(12) United States Patent
Han et al.

(10) Patent No.: US 8,779,412 B2
(45) Date of Patent: Jul. 15, 2014

(54) SEMICONDUCTOR LIGHT EMITTING DEVICE

(75) Inventors: Sang Heon Han, Suwon (KR); Do Young Rhee, Seoul (KR); Jong Hyun Lee, Seoul (KR); Jin Young Lim, Gwacheon (KR); Young Sun Kim, Suwon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/553,344

(22) Filed: Jul. 19, 2012

(65) Prior Publication Data

US 2013/0020553 A1    Jan. 24, 2013

(30) Foreign Application Priority Data

Jul. 20, 2011    (KR) ........................ 10-2011-0071977
Jun. 27, 2012    (KR) ........................ 10-2012-0069052

(51) Int. Cl.
     *H01L 33/00*      (2010.01)
     *H01L 29/06*      (2006.01)

(52) U.S. Cl.
     USPC ............................................. 257/14; 257/13

(58) Field of Classification Search
     CPC ........ B82Y 20/00; B82Y 10/00; H01L 33/06; H01L 33/32; H01L 33/04
     USPC ...................................... 257/13, 14, E33.008
     See application file for complete search history.

(56) References Cited

U.S. PATENT DOCUMENTS

| 5,319,660 | A | * | 6/1994 | Chen et al. ................. 372/45.01 |
| 6,150,672 | A | * | 11/2000 | Kaneko ........................... 257/94 |
| 6,751,244 | B2 | * | 6/2004 | Faist et al. ................. 372/45.01 |
| 2009/0224226 | A1 | * | 9/2009 | Huang et al. .................... 257/13 |
| 2011/0121259 | A1 | * | 5/2011 | Han et al. ........................ 257/13 |
| 2011/0315952 | A1 | * | 12/2011 | Yan et al. ........................ 257/13 |

FOREIGN PATENT DOCUMENTS

JP      2008-288397 A      11/2008
KR      20030005693 A      1/2003

OTHER PUBLICATIONS

Vurgaftman et al., "Band parameters for III-V compound semiconductors and their alloys", 20001, Journal of Applied Physics, vol. 89, No. 11, pp. 5815-5875, Jun. 2001.*

* cited by examiner

*Primary Examiner* — Nikolay Yushin
(74) *Attorney, Agent, or Firm* — Harness, Dickey & Pierce, P.L.C.

(57) ABSTRACT

There is provided a semiconductor light emitting device including: first and second conductivity type semiconductor layers; and an active layer disposed between the first and second conductivity type semiconductor layers and having a structure in which a plurality of quantum barrier layers and a plurality of quantum well layers are alternately disposed, wherein at least one of the plurality of quantum well layers includes a first region in which band gap energy is reduced through a first slope and a second region in which band gap energy is reduced through a second slope different from the first slope. The influence of polarization is minimized by adjusting the shape of the band gap of the quantum well layer, crystallinity and internal quantum efficiency can be enhanced.

20 Claims, 11 Drawing Sheets

SEMICONDUCTOR LIGHT EMITTING DEVICE

CROSS-REFERENCE TO RELATED APPLICATIONS

This application claims the priority of Korean Patent Application Nos. 10-2011-0071977 filed on Jul. 20, 2011, and 10-2012-0069052 filed on Jun. 27, 2012, in the Korean Intellectual Property Office, the disclosure of which is incorporated herein by reference.

BACKGROUND OF THE INVENTION

1. Field of the Invention

The present invention relates to a semiconductor light emitting device.

2. Description of the Related Art

A light emitting diode, a type of semiconductor light emitting device, is a semiconductor device capable of generating light of various colors according to electron hole recombination in p and n type semiconductor junction parts when current is applied thereto. Compared with a filament-based light emitting device, a semiconductor light emitting device has various advantages such as a long life span, low power consumption, excellent initial driving characteristics, and the like, and accordingly, demand for semiconductor light emitting devices has continued to grow. In particular, recently, a group III-nitride semiconductor capable of emitting short-wavelength blue light has come to prominence.

As semiconductor light emitting devices have made remarkable progress since being developed, the utilization thereof has been greatly expanded and research into utilizing semiconductor light emitting devices for the purpose of general illumination, as well as for light sources of electric devices, has been actively undertaken. In particular, related art semiconductor light emitting devices have largely been used as components of low-current/low output mobile products, and recently, the utilization of light emitting devices has extended into the field of high current/high output devices.

Meanwhile, in case of a nitride semiconductor grown in a polarity direction, a strong field is applied to the interior of an active layer due to polarization. Thus, wave functions of electrons and holes in the active layer are spatially separated according to the generated internal field, degrading recombination probability. Thus, in the art to which the present invention pertains, a method for improving internal quantum efficiency by minimizing a polarization effect is required.

SUMMARY OF THE INVENTION

An aspect of the present invention provides a semiconductor light emitting device capable of minimizing an influence of polarization by adjusting the shape of a band gap of a quantum well layer, and having enhanced crystallinity and internal quantum efficiency.

According to an aspect of the present invention, there is provided a semiconductor light emitting device including: first and second conductivity type semiconductor layers; and an active layer disposed between the first and second conductivity type semiconductor layers and has a structure in which a plurality of quantum barrier layers and a plurality of quantum well layers are alternately disposed, wherein at least one of the plurality of quantum well layers includes a first region in which band gap energy is reduced through a first slope in a direction in which the second conductivity type semiconductor layer is disposed and a second region in which band gap energy is reduced through a second slope different from the first slope.

At least one quantum well layer may include a third region in which band gap energy is increased through a third slope in the direction in which the second conductivity type semiconductor layer is disposed and a fourth region in which band gap energy is increased through a fourth slope different from the third slope.

The first to fourth regions may be sequentially stacked in the direction in which the second conductivity type semiconductor layer is disposed, and adjacent regions may be in contact therewith.

The first to fourth regions may be sequentially stacked in the direction in which the second conductivity type semiconductor layer is disposed, and the first and second regions may be in contact while the third and fourth regions may be in contact. The at least one quantum well layer may further include a middle region interposed between the second and third region, in which band gap energy is uniform. The thickness of the middle region may range from 1 Å to 20 Å.

An absolute value of the first slope may be equal to that of the fourth slope.

An absolute value of the second slope may be equal to that of the third slope.

At least one quantum well layer may have a symmetrical band gap shape, based on the center between the second and third regions.

The absolute value of the first slope may be greater than that of the second slope.

The absolute value of the first slope may be smaller than that of the second slope.

The at least one quantum well layer may be formed between an adjacent quantum barrier layer among the plurality of quantum barrier layers and the first region, and may have a structure in which band gap energy is smaller than that of the adjacent quantum barrier layer.

The at least one quantum well layer may be made of a nitride semiconductor containing indium (In).

The at least one quantum well layer may have an asymmetrical band gap shape, based on a central region thereof.

In the at least one quantum well layer, an interface between the second region and the third region, based on the central region, may be disposed to be biased toward the first or second conductive semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 1:
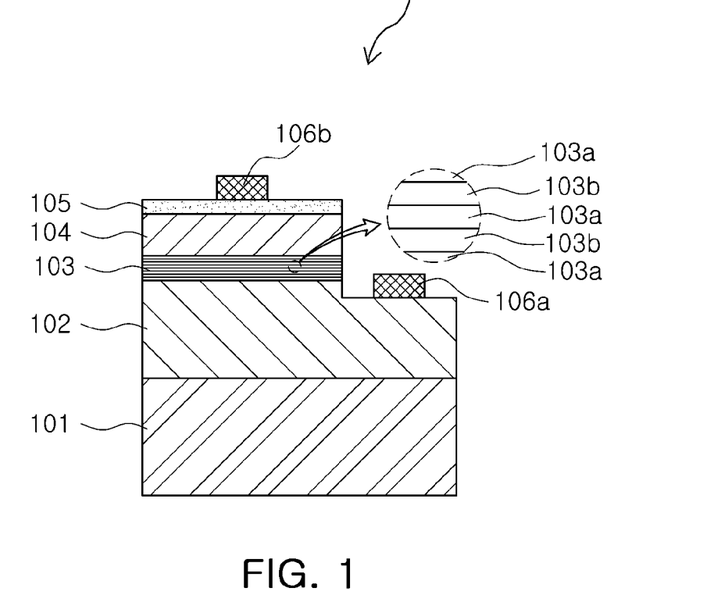
FIG. 1 is a schematic cross-sectional view of a semiconductor light emitting device according to an embodiment of the present invention.
Figure 2:
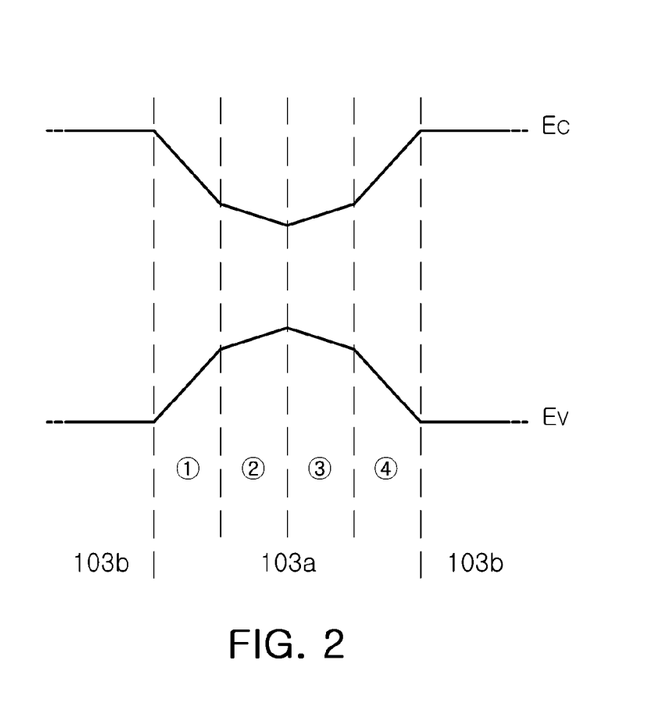
FIGS. 2 and 4 are energy band diagrams around an active layer that can be employed in the semiconductor light emitting device of FIG. 1.
Figure 4:
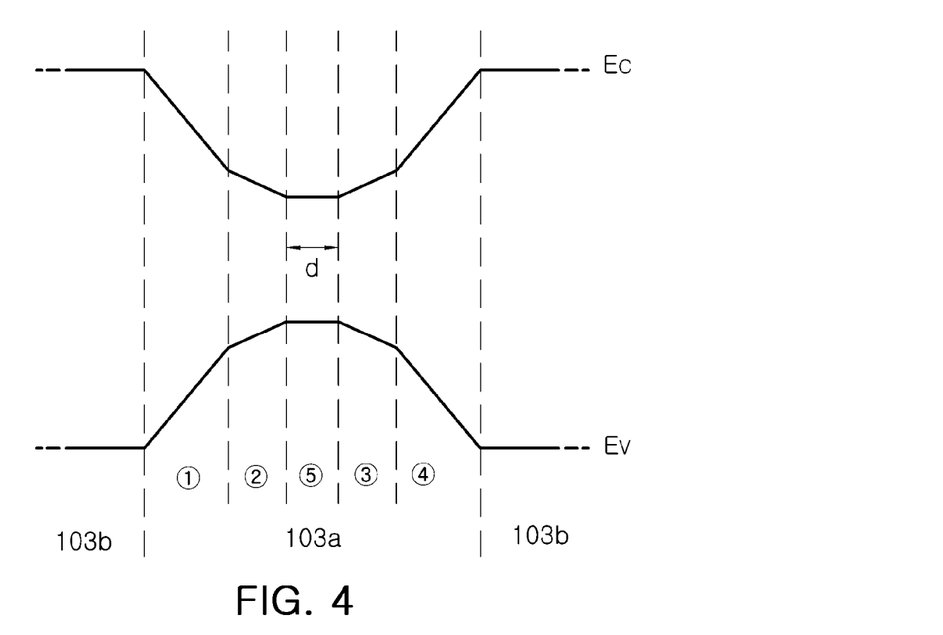

FIG. 1 is a schematic cross-sectional view of a semiconductor light emitting device according to an embodiment of the present invention. FIGS. 2 and 4 are energy band diagrams around an active layer that can be employed in the semiconductor light emitting device of FIG. 1. With reference to FIG. 1, a semiconductor light emitting device 100 according to the present embodiment includes a substrate 101, a first conductivity type semiconductor layer 102, an active layer 103, a second conductivity type semiconductor layer 104, and an ohmic-electrode layer 105. First and second electrodes 106a and 106b are formed on upper surfaces of the first conductivity type semiconductor layer 102 and the ohmic-electrode layer 105, respectively. Here, the terms 'upper portion', 'upper surface', 'lower portion', 'lower surface', 'lateral surface', or the like, are used based on the directionality of the drawings, which may be changed according to the direction in which the device is actually disposed.

The substrate 101 is a semiconductor growth substrate. As the substrate 101, a substrate made of an insulating, conductive, or semiconductor material such as sapphire, Si, SiC, $MgAl_2O_4$, MgO, $LiAlO_2$, $LiGaO_2$, GaN, or the like, may be used. In this case, sapphire having electrical insulation characteristics may be most preferably used. Sapphire is a crystal having Hexa-Rhombo R3c symmetry, of which lattice constants in c-axis and a-axis directions are 13.001 Å and 4.758 Å, respectively. A sapphire crystal has a C (0001) face, an A (1120) face, an R (1102) face, and the like. In this case, a nitride thin film can be relatively easily formed on the C face of the sapphire crystal, and because sapphire crystal is stable at high temperatures, it is commonly used as a material for a nitride growth substrate. Also, a silicon (Si) substrate may be appropriately used as the substrate 101, and mass-production can be enhanced by using the silicon (Si) substrate which is fit for a large diameter and is relatively low priced. When the silicon (Si) substrate is used, a nucleation layer made of a material such as $AlGa_{1-x}N$ may be formed on the substrate 101 and a nitride semiconductor having a desired structure may be grown on the nucleation layer.

The first and second conductivity type semiconductor layers 102 and 104 may be semiconductor layers doped with n-type and p-type impurities, respectively, but the present invention is not limited thereto. Conversely, the first and second conductivity type semiconductor layers 102 and 104 may be p-type and n-type semiconductor layers, respectively. Also, the first and second conductivity type semiconductor layers 102 and 104 may be made of a nitride semiconductor, e.g., a material having a composition of $Al_xIn_yGa_{1-x-y}N$ ($0 \leq x \leq 1, 0 \leq y \leq 1, 0 \leq x+y \leq 1$). Here, the first and second conductivity type semiconductor layers 102 and 104 may also be made of a material such as an AlGaInP-based semiconductor or AlGaAs-based semiconductor. The active layer 103 disposed between the first and second conductivity type semiconductor layers 102 and 104 emits light having a certain energy level, according to the recombination of electrons and holes and may have a multi-quantum well (MQW) structure in which quantum well layers 103a and quantum barrier layers 103b are alternately stacked, and here, in the case of the nitride semiconductor, a structure in which the quantum well layers 103a may be made of InGaN (the content of In may be variable) and the quantum barrier layers 103b may be made of GaN may be used.

In the present embodiment, the quantum well layers 103a have a band gap energy structure through which an influence of polarization charges is minimized, and details thereof will be described later. Meanwhile, the first and second conductivity type semiconductor layers 102 and 104 and the active layer 103 constituting the light emitting structure may be grown by using a process known in the art, such as metal organic chemical vapor deposition (MOCVD), hydride vapor phase epitaxy (HYPE), molecular beam epitaxy (MBE), and the like.

The ohmic-electrode layer 105 may be made of a material that exhibits electrical ohmic-characteristics with the second conductivity type semiconductor layer 104. The ohmic-electrode layer 105 may be formed of a transparent conductive oxide such as ITO, CIO, ZnO, or the like, that has high light transmittance and relatively excellent ohmic-contact performance among materials used for a transparent electrode. Alternatively, the ohmic-electrode layer 105 may be made of a light-reflective material, e.g., a highly reflective metal, and in this case, the device 100 may be used as a so-called flip-chip structure mounted toward a lead frame, or the like, of the first and second electrode 106a, 106b package. Here, the ohmic-electrode layer 105 may not be essential in the present embodiment and may be excluded according to varying circumstances.

The first and second electrodes 106a and 106b may be made of a material having electrical conductivity known in the art. For example, the first and second electrodes 106a and 106b may be formed by depositing, sputtering, or the like, one or more of silver (Ag), aluminum (Al), nickel (Ni), chromium (Cr), and the like. In the structure illustrated in FIG. 1, the first and second electrodes 106a and 106b are formed on the first conductivity type semiconductor layer 102 and the ohmic-electrode layer 105, respectively, but such an electrode (106a, 106b) formation scheme is merely an example, and electrodes may be formed in various positions on the light emitting structure including the first conductivity type semiconductor layer 102, the active layer 103, and the second conductivity type semiconductor layer 104.

With reference to FIG. 2, in the present embodiment, the quantum well layer 103a has a structure including a first region ①, in which band gap energy is reduced through a first slope in a direction in which the second conductivity type semiconductor layer 104 is disposed (or toward the second conductivity type semiconductor layer) and a second region ②, in which band gap energy is reduced through a second slope different from the first slope. In this case, an absolute value of the first slope may be greater than that of the second slope. Here, the direction in which the second conductivity type semiconductor layer 104 is disposed corresponds to an upward direction based on FIG. 1 and a rightward direction based on FIG. 2. Also, the quantum well layer 103a includes a third region ③, in which the band gap energy is increased through a third slope in a direction in which the second conductivity type semiconductor layer 104 is disposed and a fourth region ④, in which the band gap energy is increased through a fourth slope different from the third slope. In this case, an absolute value of the fourth slope may be greater than that of the third slope. Here, according to an embodiment, a region in which a slope is changed may be further included in the quantum well layer 103a. Namely, an additional region in which the band gap energy is reduced through a slope different from the first and second slopes may be formed to be adjacent to the first and second regions ① and ②, and it may be the same in case of the third and fourth regions ③ and ④.

The foregoing band gap energy structure may be simplified as follows. The first to fourth regions are sequentially stacked in the direction in which the second conductivity type semiconductor layer 104 is formed, and the adjacent regions are in contact therewith. As shown in FIG. 2, the portion between second and third regions ② and ③ has a tapered shape in the band gap energy diagram. Also, the quantum well layer 103a may be formed to have a symmetrical band gap shape, based on the center between the second and third regions ② and ③. Alternatively, the band gap shape may be asymmetrical according to an embodiment, and this may be the same in the following embodiments. A case in which the band gap is asymmetrical will be described below in detail with reference to FIGS. 14 to 17.

Figure 3:
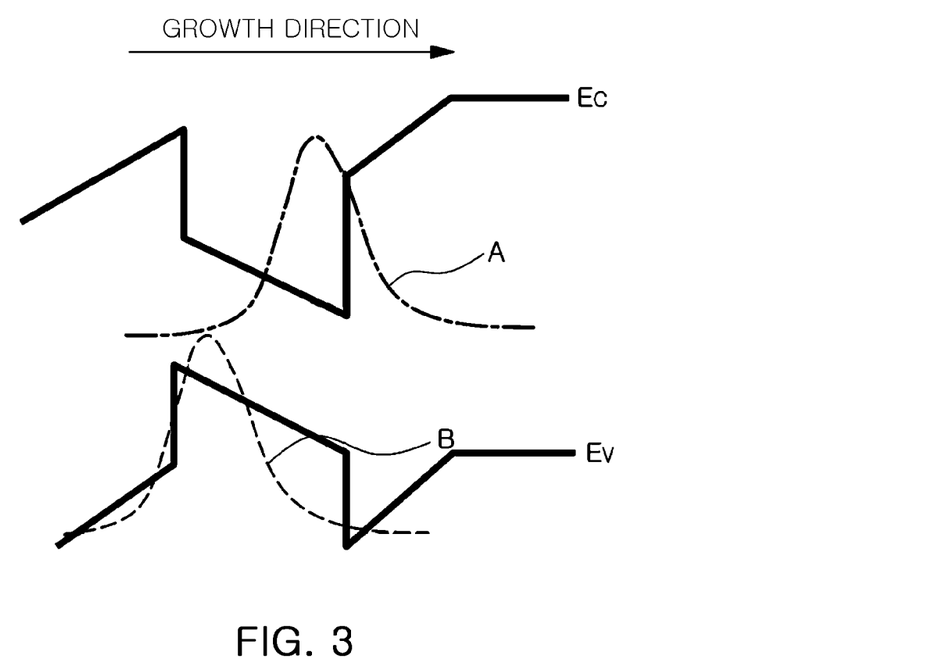
FIG. 3 is a view showing a band gap diagram along with a wave function of a carrier in a related art active layer.

The band gap energy structure of the quantum well layer 103a aims at minimizing a region in which band gap energy is uniform, whereby degradation of luminous efficiency due to a polarization effect can be minimized. This will be described in detail. FIG. 3 is a view showing a band gap diagram along with a wave function of a carrier in a related art active layer. In case of a nitride semiconductor grown from a polarity plane such as C plane, or the like, of the sapphire substrate, polarization charges are generated therein, and in particular, a large internal field is induced by polarization charges on the interface between heterogeneous materials having a great difference in energy level. Thus, as shown in FIG. 3, the highest point of the wave function A representing the distribution of electrons appears to be slanted to the a p type nitride semiconductor layer, and a wave function B of holes appears to be slanted to an n type nitride layer. In this manner, since the wave function A of electrons and the wave function B of holes are positioned at the opposite sides in the quantum well layer, electron hole emission recombination efficiency is reduced due to the characteristics that the electron hole emission recombination efficiency is proportional to an area in which the two wave functions overlap, and as a result, the amount of luminescence is also reduced. Such a wave function separation phenomenon is salient when the band gap energy of the well layer is uniformly maintained.

In the present embodiment, the region in which the band gap energy is uniform in the quantum well layer 103a is minimized to reduce the size of internal field, and also, in order to minimize a change in a composition such as a rapid change in the band gap energy in the interface of the quantum barrier layer 103b and the quantum well layer 103a, e.g., a sharp increase in the content of indium (In) in the quantum well layer 103a, the band gap energy is increased or reduced through a particular slope. Thus, the influence of the polarization charges within the quantum well layer 103a is reduced to minimize the phenomenon in which the wave functions of electrons and holes are separated, thus increasing the electron hole recombination efficiency. The band gap energy in the quantum well layer 103a can be changed by appropriately changing the composition of the material constituting the quantum well layer 103a. For example, when the content of indium (In) of the quantum well layer 103a made of InGaN is gradually increased, the band gap energy can be gradually reduced. Similarly, when the content of indium (In) of the quantum well layer 103a made of InGaN is gradually reduced, the band gap energy can be gradually increased. In this case, the content of indium (In) may be increased or reduced by appropriately regulating the growth conditions of the quantum well layer 103a. For example, the content of indium (In) may be increased by using a method of increasing the content of an indium source gas, lowering a growth temperature, or the like.

Also, in the present embodiment, the band gap energy of the quantum well layer 103a is not reduced or increased through only a single slope, and there may be regions with slopes having different sizes. Namely, the band gap energy of the first region ① may be reduced through a slope having an absolute value greater than that of the second region ②, and the band gap energy of the fourth region ④ may be reduced through a slope having an absolute value greater than that of the third region ③. If band gap energy is reduced through only the slope of the first region ①, and the band gap energy is increased through only the slope of the fourth region ④, in order to remove the region having uniform band gap energy, a point at which the band gap energy is minimized, namely, a point at which the first and fourth regions meet, is lower than that of the case of FIG. 2. In this manner, in order to obtain a region having low band gap energy, the content of indium (In) should be drastically increased, which, however, degrades crystallinity of the well layer 103a and other semiconductor layers grown thereon. Also, if band gap energy is reduced through only the slope of the second region ② and the band gap energy is increased through only the slope of the third region ③, a point at which the band gap energy is minimized, namely, a point at which the second and third regions meet, is higher than that of the case of FIG. 2, but the size of the quantum well layer 103a is reduced and a carrier confinement effect is lowered to thereby degrade luminous efficiency.

In the present embodiment having the structure in which the separation of wave functions due to the polarization charges is minimized by reducing the region having uniform band gap energy, since the band gap energy is reduced through the slope having a great absolute value and then reduced through a smaller slope, the size of the quantum well layer 103a and the carrier confinement effect can be sufficiently secured without greatly degrading the crystallinity of the quantum well layer 103a.

Meanwhile, in order to minimize the influence of the polarization charges, preferably, the region having uniform band gap energy is not included in the quantum well layer 103a, but it may be difficult to allow the energy level have an accurately tapered shape according to fabrication process conditions. Thus, a region having uniform band gap energy may be included with a certain thickness in the quantum well layer 103a. Namely, as in the modification illustrated in FIG. 4, a middle region ⑤ in which band gap energy is uniform may be interposed between the second and third regions. Also, in this case, in order to reduce the influence of polarization charges, the middle region ⑤ may have a small thickness ranging from 1 Å to 20 Å.

Figure 5:
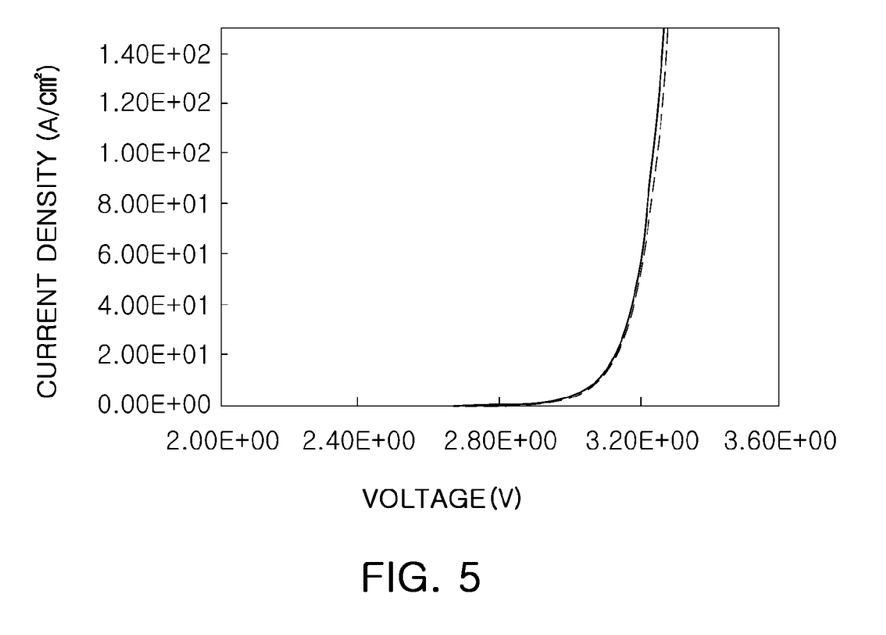
FIG. 5 is a graph showing a comparison between current density over voltage in the semiconductor light emitting device according to an embodiment of the present invention and that of the related art.
Figure 6:
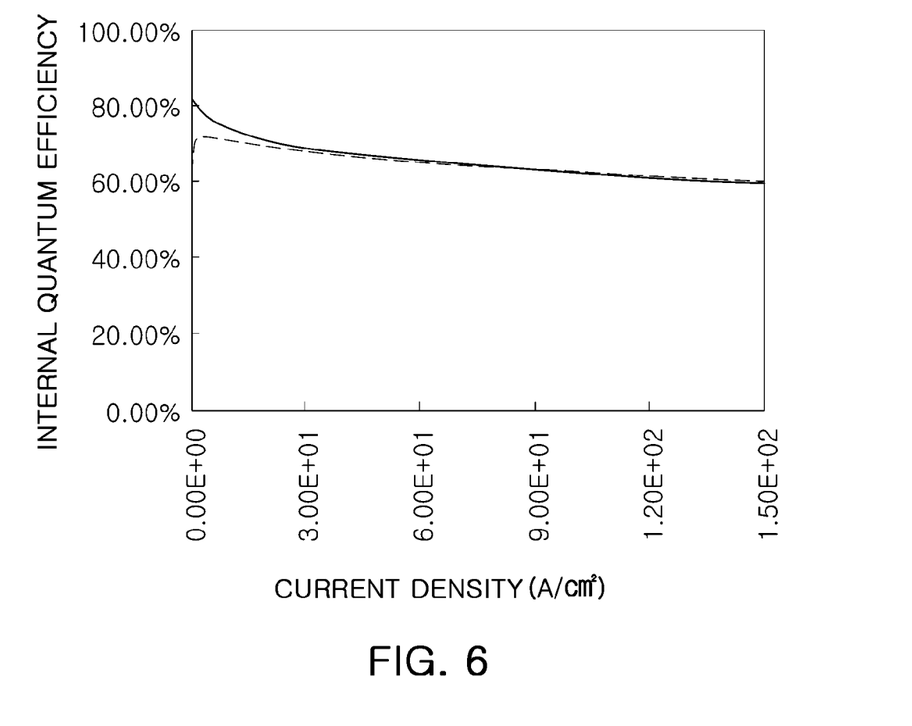
FIG. 6 is a graph showing comparison between internal quantum efficiency over current density in the semiconductor light emitting device according to an Embodiment Example of the present invention and that of a Comparative Example.
Figure 7:
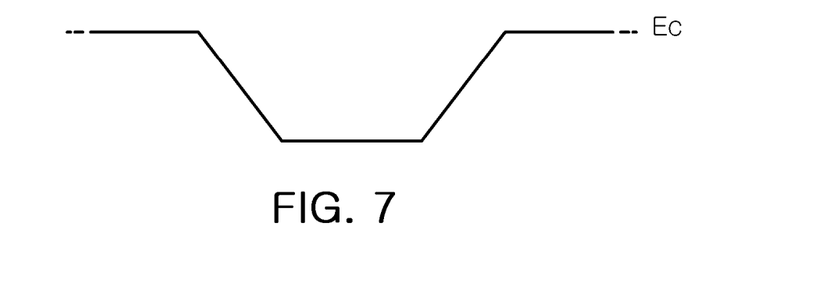
FIG. 7 is a view showing a conduction band energy level in the vicinity of a quantum well layer of the Comparative Example.

FIG. 5 is a graph showing comparison between current density over voltage in the semiconductor light emitting device according to an embodiment of the present invention and that of the related art. FIG. 6 is a graph showing comparison between internal quantum efficiency over current density in the semiconductor light emitting device according to an Embodiment Example of the present invention and that of a Comparative Example. The embodiment (the solid line) of the present invention employed the quantum well layer having the band gap energy structure described above with reference to FIG. 2, and the Comparative Example employed a quantum well layer having an energy level in the form illustrated in FIG. 7. Namely, in the Comparative Example, band gap energy is uniform in the second and third regions ② and ③ of the band gap structure of FIG. 2. With reference to FIG. 5, in case of the current density over voltage, the Embodiment and the Comparative Example show similar characteristics, but as noted in FIG. 6, at a current density of about 50 A/cm$^2$ or lower, the Embodiment exhibits higher internal quantum efficiency. It may be understood that the increase in the internal quantum efficiency of the Embodiment is due to the reduction in the influence of the polarization charges within the quantum well layer 103a as described above.

Figure 8:
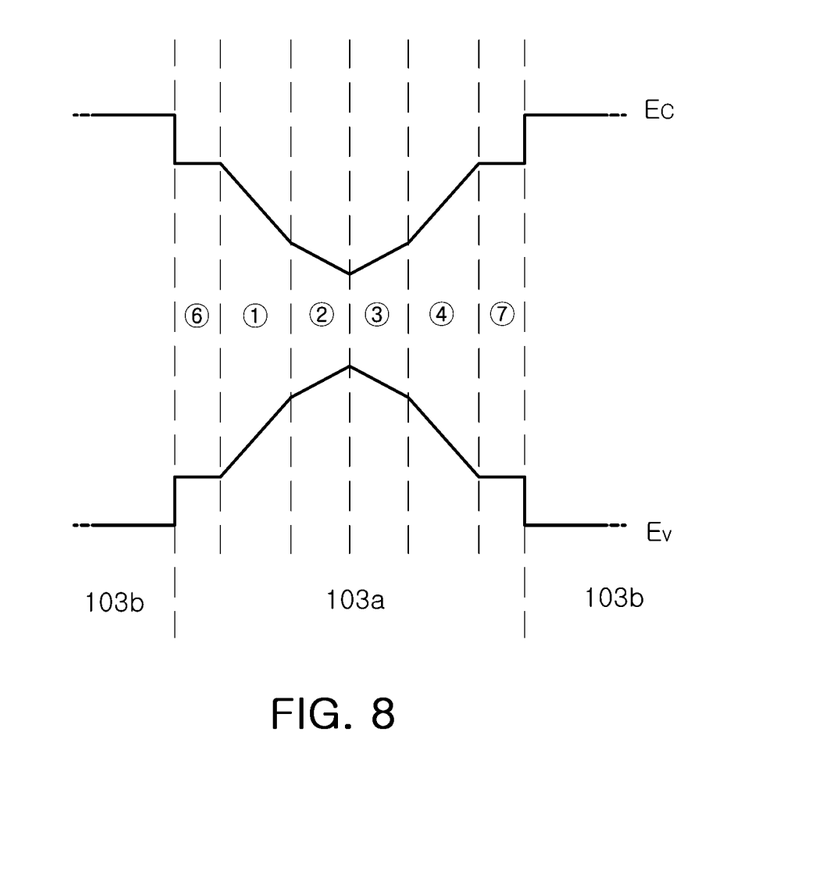
FIGS. 8 and 9 are views showing modifications of the energy band diagram in the vicinity of the active layer that can be employed in the semiconductor light emitting device of FIG. 1, respectively.
Figure 9:
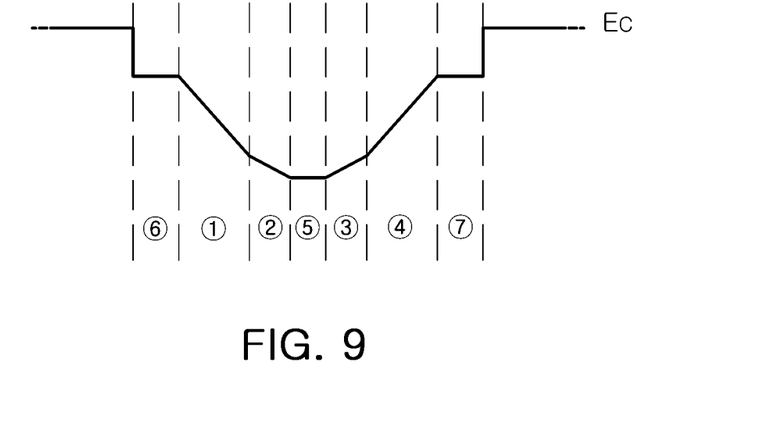

FIGS. 8 and 9 are views showing modifications of the energy band diagram in the vicinity of the active layer that can be employed in the semiconductor light emitting device of FIG. 1, respectively. The embodiments of FIGS. 8 and 9 are obtained by adding step structures ⑥ and ⑦ to the band gap energy structure of FIGS. 2 and 4. The step structures ⑥ and ⑦ are formed between the adjacent quantum barrier layers 103b and the first and fourth regions ① and ④, respectively, and have band gap energy smaller than that of the adjacent quantum barrier layers 103b. Owing to the step structures ⑥ and ⑦, the efficiency of injecting carriers into the quantum well layer 103a can be further increased.

Figure 10:
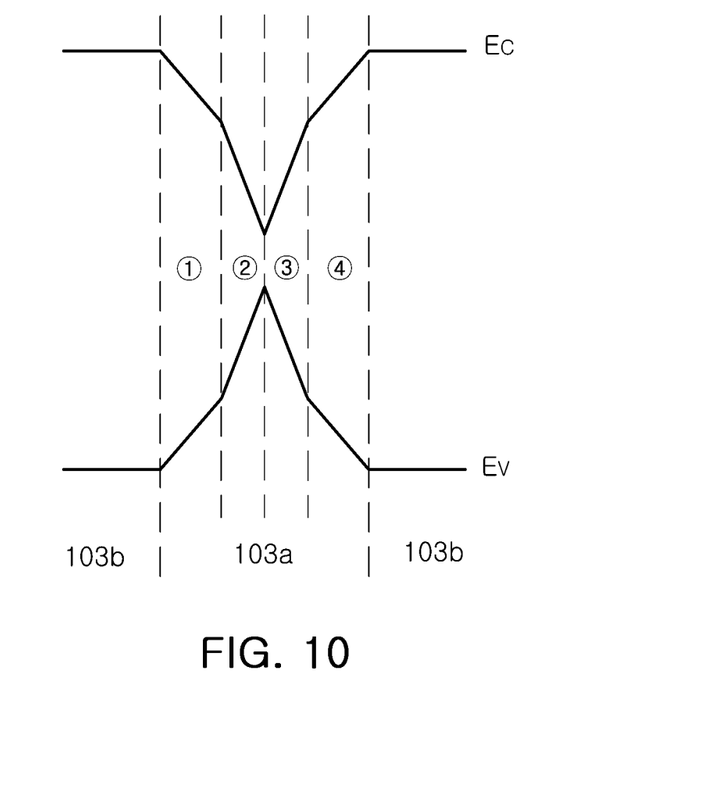
FIGS. 10 and 11 are views showing different modifications of the energy band diagram in the vicinity of the active layer that can be employed in the semiconductor light emitting device of FIG. 1, respectively.
Figure 11:
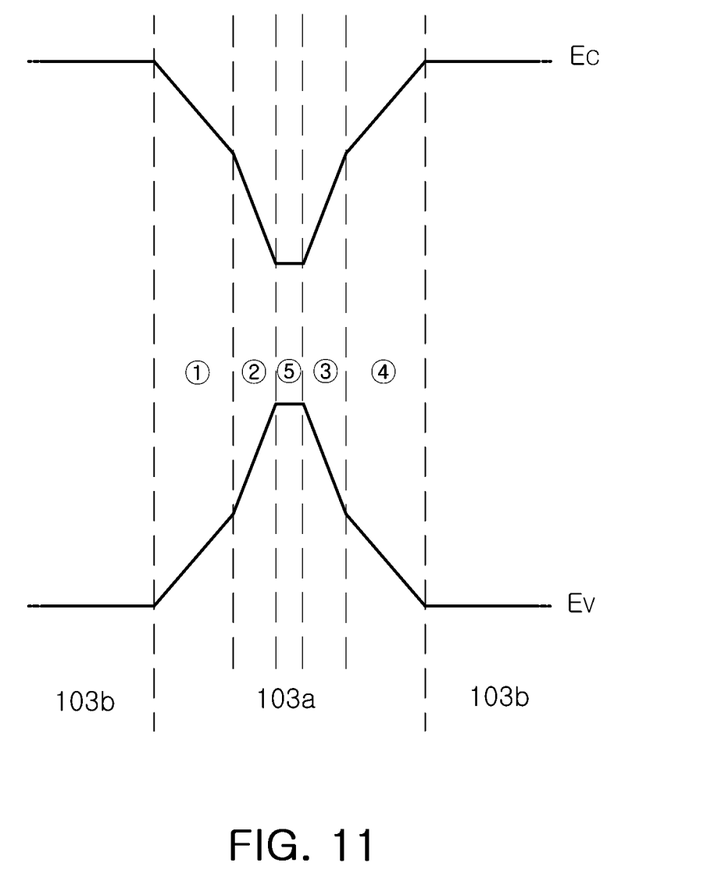

FIGS. 10 and 11 are views showing different modifications of the energy band diagram in the vicinity of the active layer that can be employed in the semiconductor light emitting device of FIG. 1, respectively. The embodiments of FIGS. 10 and 11 have a structure in which the aspect of change in the slope in the band gap energy of FIGS. 2 and 4 is the opposite. Namely, the quantum well layer 103a has a structure including a first region ① in which band gap energy is reduced through a first slope in the direction in which the second conductivity type semiconductor layer is disposed (or toward the second conductivity type semiconductor layer) and a second region ② in which band gap energy is reduced through a second slope having an absolute value greater than that of the first slope. Also, the quantum well layer 103a includes a third region ③ in which band gap energy is increased through a third slope in the direction in which the second conductivity type semiconductor layer is disposed and a fourth region ④ in which band gap energy is increased through a fourth slope having an absolute value smaller than that of the third slope. In this case, the quantum well layer 103a may be formed such that the band gap shape is symmetrical based on the center between the second and third regions ② and ③, but the present invention is not necessarily limited thereto. Besides the reduction in the influence of the polarization charges, when the band gap energy makes a great change, namely, when the absolute value of the slope is large, in the vicinity of the region having the lowest band gap energy, carriers can gather to a relatively narrow region, anticipating enhancement of the recombination efficiency.

Figure 12:
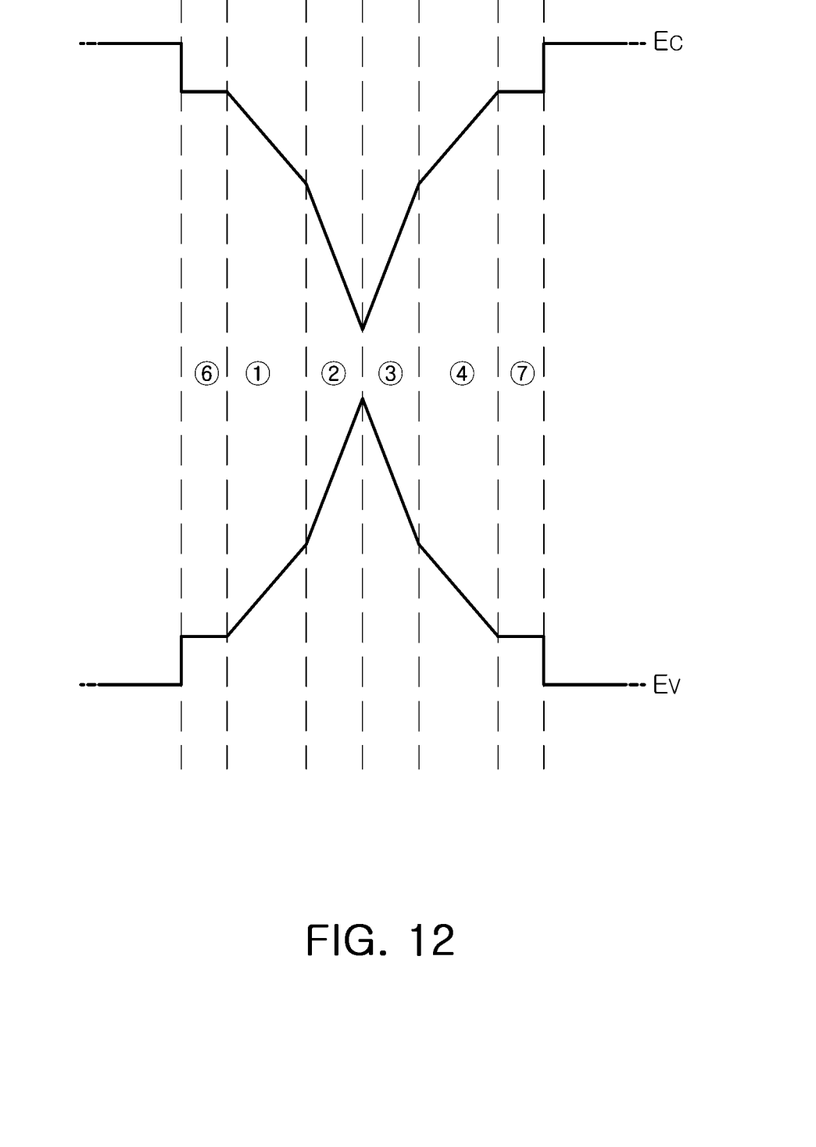
FIGS. 12 and 13 are views showing different modifications of the energy band diagram in the vicinity of the active layer that can be employed in the semiconductor light emitting device of FIG. 1, respectively.
Figure 13:
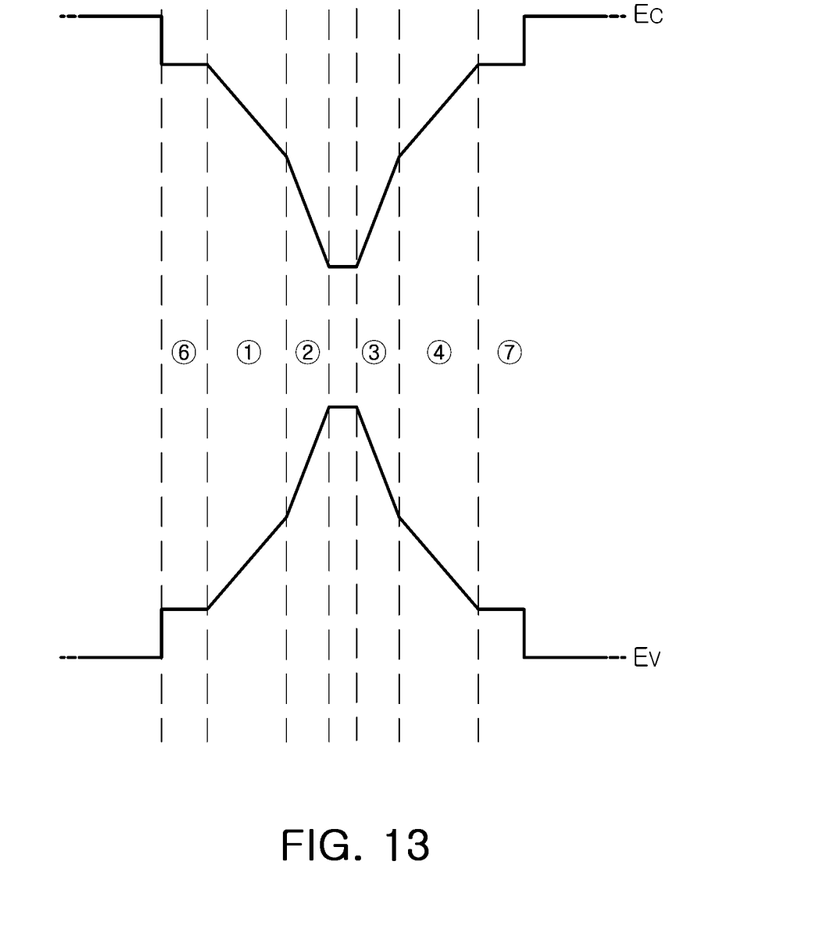

FIGS. 12 and 13 are views showing different modifications of the energy band diagram in the vicinity of the active layer that can be employed in the semiconductor light emitting device of FIG. 1. The embodiments of FIGS. 12 and 13 are obtained by adding the step structures ⑥ and ⑦ to the band gap energy structure of FIGS. 10 and 11. The step structures ⑥ and ⑦ are formed between the adjacent quantum barrier layers 103b and the first and fourth regions ① and ④, respectively, and have band gap energy smaller than that of the adjacent quantum barrier layers 103b. Owing to the step structures and ⑦, the efficiency of injecting carriers into the quantum well layer 103a can be further increased.

Figure 14:
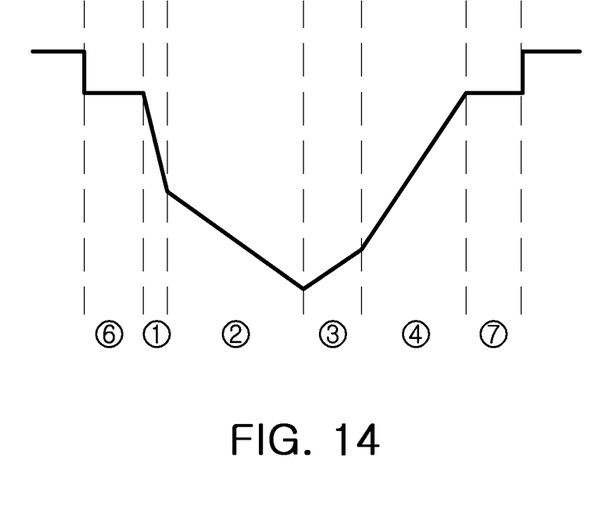
FIGS. 14 and 15 are views showing different modifications of the energy band diagram in the vicinity of the active layer that can be employed in the semiconductor light emitting device of FIG. 1, respectively.
Figure 15:
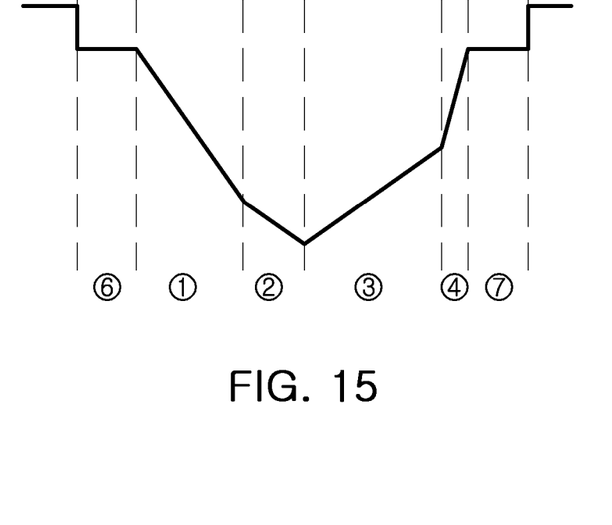

FIGS. 14 and 15 are views showing different modifications of the energy band diagram in the vicinity of the active layer that can be employed in the semiconductor light emitting device of FIG. 1, respectively. In an embodiment with reference to FIGS. 14 and 15, unlike the previously described embodiment, the at least one quantum well layer may have an asymmetrical structure, based on a central region thereof. That is, slopes in band gap energies of the first and fourth regions ① and ④ may have different absolute values, and further, slopes in band gap energies of the second and third regions ② and ③ may also be different from each other. In the case in which the quantum well layer has an asymmetrical structure as described above, a piezoelectric effect and strain may be significantly relieved. In the embodiment of FIGS. 14 and 15, on the other hand, step structures ⑥ and ⑦ may additionally be provided, but may also be omitted according to respective embodiments.

Figure 16:
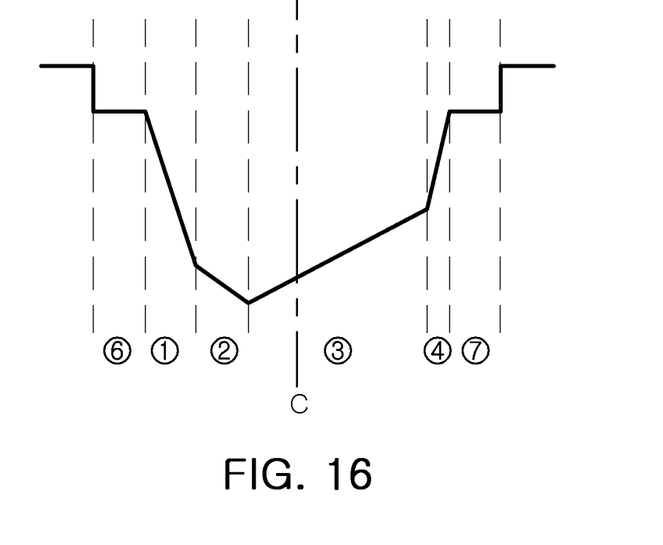
FIGS. 16 and 17 are views showing different modifications of the energy band diagram in the vicinity of the active layer that can be employed in the semiconductor light emitting device of FIG. 1, respectively.
Figure 17:
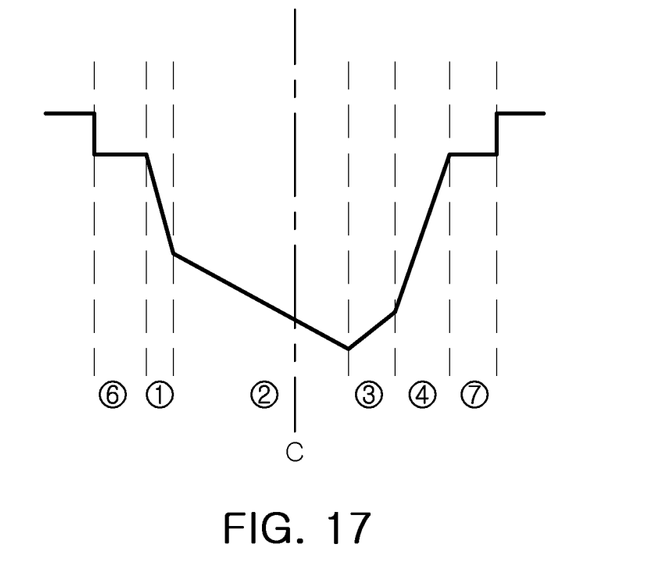

FIGS. 16 and 17 are views showing different modifications of the energy band diagram in the vicinity of the active layer that can be employed in the semiconductor light emitting device of FIG. 1, respectively. In the embodiment of FIGS. 16 and 17, in a similar manner to FIGS. 14 and 15, an asymmetrical structure may be provided, but there is merely a difference therebetween, in that an interface between the second and third regions ② and ③ is formed in a region thereof outside of the central region C of the quantum well layer. That is, the interface between the second and third regions ② and ③ may be disposed to be biased toward the first conductive semiconductor layer (FIG. 16) or the second conductive semiconductor layer (FIG. 17), based on the central region C. In addition, in FIGS. 16 and 17, the step structures ⑥ and ⑦ may also be additionally provided, but may be omitted according to respective embodiments.

Figure 18:
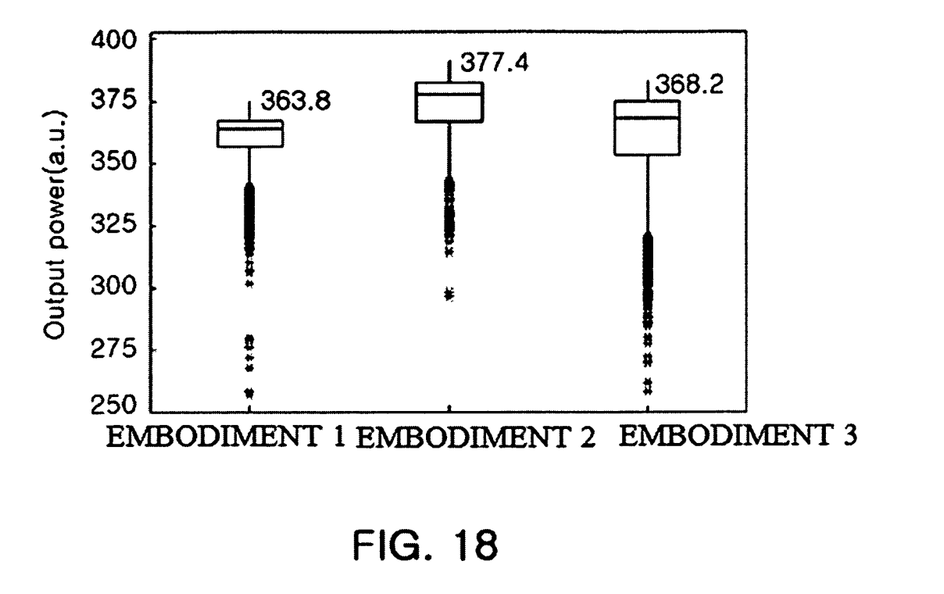
FIG. 18 is a graph illustrating an operating voltage of the semiconductor light emitting device according to embodiments of the present invention.
Figure 19:
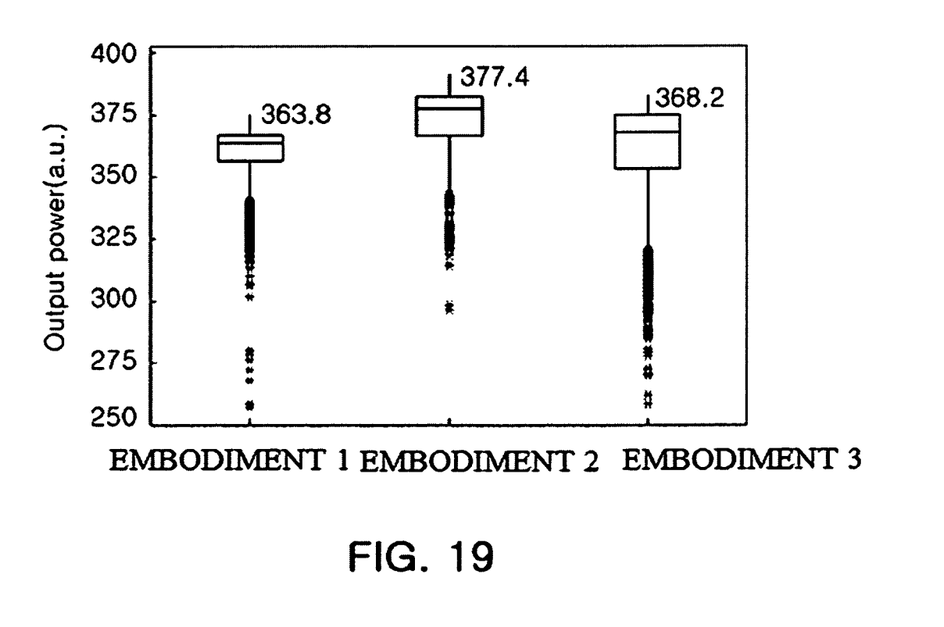
FIG. 19 is a graph illustrating output power in the semiconductor light emitting device according to embodiments of the present invention.

FIG. 18 is a graph illustrating an operating voltage VF in the semiconductor light emitting device according to embodiments of the present invention. FIG. 19 is a graph illustrating output power in the semiconductor light emitting device according to embodiments of the present invention. In this case, embodiment 1 refers to a device having a quantum well structure form shown in FIG. 8, and embodiments 2 and 3 respectively refer to devices having quantum well structure forms shown in FIGS. 14 and 15.

Referring to FIGS. 18 and 19, in the case of the device having an asymmetrical band gap energy structure in embodiments 2 and 3, an operating voltage slightly increased as compared with the device having a symmetrical band gap energy structure in embodiment 1. Unlike this case, it could be appreciated that in terms of output power, the devices having an asymmetrical band gap energy structure in embodiments 2 and 3 were respectively increased power output by about 13 mW and 4 mW as compared with the device having a symmetrical band gap energy structure in embodiment 1. The results above were measured at 350 mA and it can be appreciated therefrom that an asymmetrical band gap energy structure may be more useful in a high output apparatus such as illumination devices.

As set forth above, according to embodiments of the invention, in the semiconductor light emitting device, the influence of polarization can be minimized by adjusting the shape of the band gap of the quantum well layer, crystallinity and internal quantum efficiency can be enhanced.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device comprising:
   first and second conductivity type semiconductor layers; and
   an active layer disposed between the first and second conductivity type semiconductor layers and having a structure in which a plurality of quantum barrier layers and a plurality of quantum well layers are alternately disposed,
   wherein at least one of the plurality of quantum well layers includes a first region in which band gap energy is reduced linearly through a first slope in a direction in which the second conductivity type semiconductor layer is disposed and a second region in which band gap energy is reduced linearly through a second slope different from the first slope,
   the band gap energy is reduced linearly through an entire part of the first region, and
   the band gap energy is reduced linearly through an entire part of the second region.

2. The semiconductor light emitting device of claim 1, wherein the absolute value of the first slope is greater than that of the second slope.

3. The semiconductor light emitting device of claim 1, wherein the absolute value of the first slope is smaller than that of the second slope.

4. The semiconductor light emitting device of claim 1, wherein the at least one quantum well layer is formed between an adjacent quantum barrier layer among the plurality of quantum barrier layers and the first region, and has a step structure in which band gap energy is smaller than that of the adjacent quantum barrier layer.

5. The semiconductor light emitting device of claim 1, wherein the at least one quantum well layer is made of a nitride semiconductor containing indium (In).

6. The semiconductor light emitting device of claim 1, wherein the at least one quantum well layer has an asymmetrical band gap shape, based on a central region thereof.

7. The semiconductor light emitting device of claim 1, wherein in the at least one quantum well layer, an interface between the second region and a third region, based on a central region thereof, is disposed to be biased toward the first or second conductivity type semiconductor layer.

8. The semiconductor light emitting device of claim 1, wherein at least one quantum well layer comprises a third region in which band gap energy is increased through a third slope in the direction in which the second conductivity type semiconductor layer is disposed and a fourth region in which band gap energy is increased through a fourth slope different from the third slope.

9. The semiconductor light emitting device of claim 8, wherein the first to fourth regions are sequentially stacked in the direction in which the second conductivity type semiconductor layer is disposed, and adjacent regions are in contact therewith.

10. The semiconductor light emitting device of claim 8, wherein an absolute value of the first slope is equal to that of the fourth slope.

11. The semiconductor light emitting device of claim 8, wherein an absolute value of the second slope is equal to that of the third slope.

12. The semiconductor light emitting device of claim 11, wherein semiconductor light emitting device of claim 1, wherein at least one quantum well layer has a symmetrical band gap shape, based on the center between the second and third regions.

13. The semiconductor light emitting device of claim 8, wherein the first to fourth regions are sequentially stacked in the direction in which the second conductivity type semiconductor layer is disposed, and the first and second regions are in contact while the third and fourth regions are in contact.

14. The semiconductor light emitting device of claim 13, wherein the at least one quantum well layer further comprises a middle region interposed between the second and third region, in which band gap energy is uniform.

15. The semiconductor light emitting device of claim 14, wherein the thickness of the middle region ranges from 1 Å to 20 Å.

16. A semiconductor light emitting device comprising:
    first and second conductivity type semiconductor layers; and
    an active layer disposed between the first and second conductivity type semiconductor layers and having a structure in which a plurality of quantum barrier layers and a plurality of quantum well layers are alternately disposed, wherein
    at least one of the plurality of quantum well layers includes a first region and a second region,
    a band gap energy of an entire part of the first region is reduced linearly through a first slope in a direction in which the second conductivity type semiconductor layer is disposed, and
    a band gap energy of an entire part of the second region gradually varies linearly in a thickness direction of the second region according to a second slope that is different from the first slope.

17. The semiconductor light emitting device of claim 16, wherein the absolute value of the first slope is greater than that of the second slope.

18. The semiconductor light emitting device of claim 16, wherein the at least one quantum well layer is formed between an adjacent quantum barrier layer among the plurality of quantum barrier layers and the first region, and has a step structure in which band gap energy is smaller than that of the adjacent quantum barrier layer.

19. The semiconductor light emitting device of claim 16, wherein the at least one quantum well layer has an asymmetrical band gap shape, based on a central region thereof.

20. The semiconductor light emitting device of claim 16, wherein in the at least one quantum well layer, an interface between the second region and a third region, based on a central region thereof, is disposed to be biased toward the first or second conductivity type semiconductor layer.

* * * * *